US012332182B2

United States Patent
Price et al.

(10) Patent No.: US 12,332,182 B2
(45) Date of Patent: Jun. 17, 2025

(54) SYSTEM FOR AUTOMATIC DIAGNOSTICS AND MONITORING OF SEMICONDUCTOR DEFECT DIE SCREENING PERFORMANCE THROUGH OVERLAY OF DEFECT AND ELECTRICAL TEST DATA

(71) Applicant: KLA Corporation, Milpitas, CA (US)

(72) Inventors: David W. Price, Austin, TX (US);
Robert J. Rathert, Mechanicsville, VA (US); Chet V. Lenox, Lexington, TX (US); Oreste Donzella, San Ramon, CA (US); Justin Lach, Portage, MI (US); John Robinson, Austin, TX (US)

(73) Assignee: KLA Corporation, Milpitas, CA (US)

( * ) Notice: Subject to any disclaimer, the term of this patent is extended or adjusted under 35 U.S.C. 154(b) by 533 days.

(21) Appl. No.: 17/732,212

(22) Filed: Apr. 28, 2022

(65) Prior Publication Data
US 2023/0236132 A1    Jul. 27, 2023

Related U.S. Application Data

(60) Provisional application No. 63/303,977, filed on Jan. 27, 2022.

(51) Int. Cl.
*G01N 21/88* (2006.01)
*G01N 21/95* (2006.01)
(Continued)

(52) U.S. Cl.
CPC ..... *G01N 21/8851* (2013.01); *G01N 21/9501* (2013.01); *G03F 7/7065* (2013.01);
(Continued)

(58) Field of Classification Search
CPC ............... G01N 21/8851; G01N 21/08; G01N 21/9501; G01N 2021/8854; G03F 7/7065;
(Continued)

(56) References Cited

U.S. PATENT DOCUMENTS 6,610,550 B1    8/2003 Pasadyn et al.
6,810,296 B2    10/2004 Bode et al.
(Continued)

FOREIGN PATENT DOCUMENTS

JP          09203765 A       8/1997
JP      2003329611 A    *  11/2003

OTHER PUBLICATIONS

Machine Translation of Description of JP-2003329611-A, 2003.*
(Continued)

*Primary Examiner* — Manuel L Barbee
(74) *Attorney, Agent, or Firm* — Suiter Swantz IP

(57) ABSTRACT

Systems and methods for determining a diagnosis of a screening system are disclosed. Such systems and methods include identifying defect results based on inline characterization tool data, identifying electrical test results based on electrical test data, generating one or more correlation metrics based on the defect results and the electrical test results, and determining at least one diagnosis of the screening system based on the one or more correlation metrics, the diagnosis corresponding to a performance of the screening system.

42 Claims, 12 Drawing Sheets

(51) Int. Cl.
*G03F 7/00* (2006.01)
*H01L 21/66* (2006.01)

(52) U.S. Cl.
CPC .............. *H01L 22/12* (2013.01); *H01L 22/14* (2013.01); *G01N 2021/8854* (2013.01)

(58) Field of Classification Search
CPC ............. G03F 7/70653; G03F 7/70655; G03F 7/70658; H01L 22/12; H01L 22/14
See application file for complete search history.

(56) References Cited

U.S. PATENT DOCUMENTS

| | | | |
|---|---|---|---|
| 7,415,378 B2 | 8/2008 | Mollat et al. | |
| 7,760,929 B2 | 7/2010 | Orbon et al. | |
| 8,918,753 B2 | 12/2014 | Akar et al. | |
| 9,689,923 B2 | 6/2017 | Kekare | |
| 10,228,421 B2 | 3/2019 | Leu | |
| 10,267,853 B2 | 4/2019 | Changchien et al. | |
| 10,539,612 B2 | 1/2020 | Duffy | |
| 10,761,128 B2 | 9/2020 | Price et al. | |
| 11,293,970 B2 | 4/2022 | Price et al. | |
| 2004/0004482 A1* | 1/2004 | Bouabdo | G01R 31/2846 324/501 |
| 2008/0172190 A1 | 7/2008 | Lee | |
| 2014/0303912 A1 | 10/2014 | Banerjee et al. | |
| 2016/0231371 A1 | 8/2016 | Rasbornig et al. | |
| 2020/0091012 A1* | 3/2020 | Choi | H01L 22/20 |
| 2021/0239757 A1 | 8/2021 | Price et al. | |

OTHER PUBLICATIONS

Korean Intellectual Property Office, International Search Report and Written Opinion for International Application No. PCT/US2023/010726, May 16, 2023, 9 pages.
U.S. Appl. No. 17/333,770, filed May 28, 2021, Rathert et al.
U.S. Appl. No. 63/303,977, filed Jan. 27, 2022, Price.

* cited by examiner

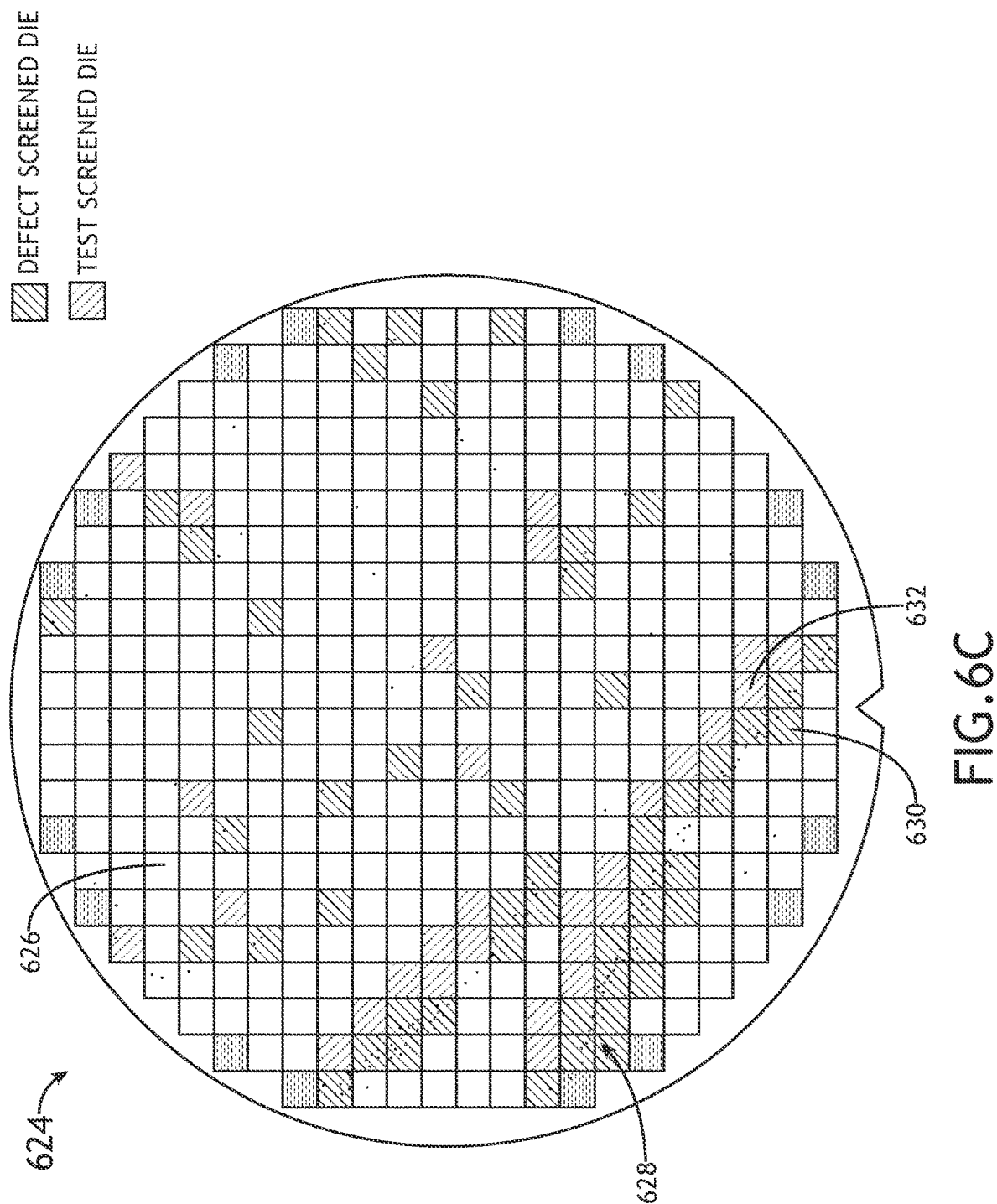

SYSTEM FOR AUTOMATIC DIAGNOSTICS AND MONITORING OF SEMICONDUCTOR DEFECT DIE SCREENING PERFORMANCE THROUGH OVERLAY OF DEFECT AND ELECTRICAL TEST DATA

CROSS-REFERENCE TO RELATED APPLICATION

The present application claims the benefit under 35 U.S.C. § 119(e) of U.S. Provisional Application Ser. No. 63/303,977 filed on Jan. 27, 2022, titled "System for automatic diagnostics and monitoring of semiconductor defect die screening performance through overlay of defect and electrical test data", which is incorporated herein by reference in the entirety.

TECHNICAL FIELD

The present disclosure relates generally to die screening systems, and, more particularly, to diagnostics of performance of die screening systems.

BACKGROUND

In the course of manufacturing a semiconductor device, a wafer goes through hundreds of processing steps to pattern a functioning device. Over the course of these steps, inspection and metrology steps are performed to ensure the process is in control and will produce a functioning product at the end of the manufacturing cycle. Inspection tools may find unintended defects in the patterned structures of the devices, while metrology tools may measure the physical parameters of features of the device (e.g., film thickness, patterns, overlay, etc.) versus the intended physical parameters. Electrical test tools (e.g., electric probes) may also be used to test for defects by testing for proper electrical function of a device.

Risk averse users of semiconductor devices, such as automotive, military, aeronautical, and medical applications, need failure rates in the Parts per Billion (PPB) range, well below typical rates. Recognizing and screening out devices that do fail or may fail in the future is key to meeting these industry requirements. While some defects and metrology errors may be so significant as to clearly indicate a device failure, lesser variations may have an unclear effect. A portion of these lesser defects (e.g., latent reliability defects) may later go on to cause early reliability failures of the device after exposure to its working environment. A variety of factors may affect the ability to accurately screen for devices that fail or may fail in the future. For example, it is not always possible to quickly know when a component used in a screening process is accurately calibrated or functioning properly.

SUMMARY

A screening system is disclosed, in accordance with one or more embodiments of the present disclosure. In one illustrative embodiment, the screening system includes a controller communicatively coupled to one or more sample analysis tools. In another illustrative embodiment, the controller includes one or more processors and memory. In another illustrative embodiment, the memory is configured to store a set of program instructions. In another illustrative embodiment, the one or more processors are configured to execute program instructions causing the one or more processors to identify defect results for a population of dies based on inline characterization tool data received from the at least one inline characterization tool of the one or more sample analysis tools. In another illustrative embodiment, the one or more processors are configured to execute program instructions causing the one or more processors to identify electrical test results for the population of dies based on electrical test data received from the at least one electrical test tool of the one or more sample analysis tools. In another illustrative embodiment, the one or more processors are configured to execute program instructions causing the one or more processors to generate one or more correlation metrics based on the identified defect results and the identified electrical test results. In another illustrative embodiment, the one or more processors are configured to execute program instructions causing the one or more processors to determine at least one diagnosis of the screening system based on the one or more correlation metrics, the at least one diagnosis corresponding to a performance of the screening system.

A method for screening is disclosed, in accordance with one or more embodiments of the present disclosure. In one illustrative embodiment, the method includes identifying defect results for a population of dies based on inline characterization tool data received from at least one inline characterization tool of one or more sample analysis tools of a screening system. In one illustrative embodiment, the method includes identifying electrical test results for the population of dies based on electrical test data received from at least one electrical test tool of the one or more sample analysis tools. In one illustrative embodiment, the method includes generating one or more correlation metrics based on the identified defect results and the identified electrical test results. In one illustrative embodiment, the method includes determining at least one diagnosis of the screening system based on the one or more correlation metrics, the at least one diagnosis corresponding to a performance of the screening system.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 6C illustrates a diagrammatic representation of the wafer of FIG. 6B, in accordance with one or more embodiments of the present disclosure;

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to determining a diagnosis of a performance of a screening system. For example, embodiments of the present disclosure are directed to determining a diagnosis of a performance using correlation metrics, which may be calculated based on a comparison of defect results and electrical test results.

Figure 3B:
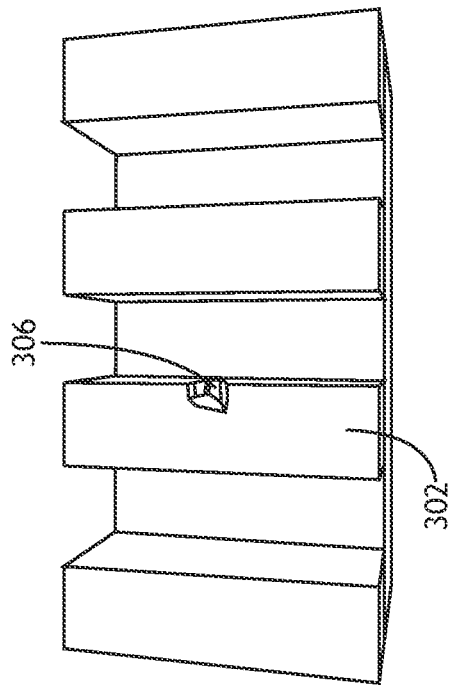
FIG. 3B illustrates a diagrammatic three-dimensional representation of a latent reliability defect, in accordance with one or more embodiments of the present disclosure.
Figure 3A:
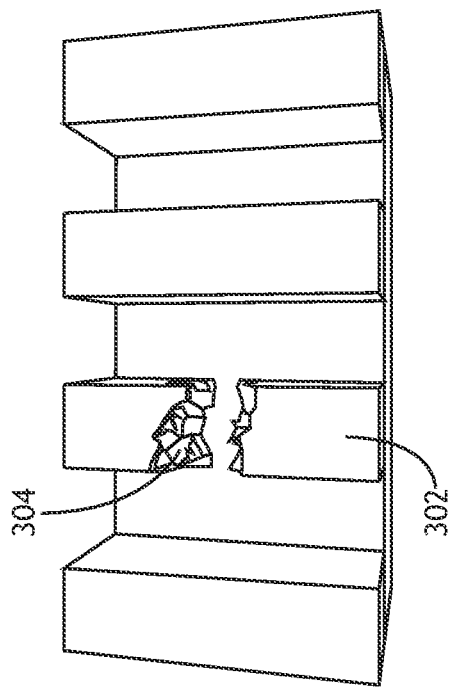
FIG. 3A illustrates a diagrammatic three-dimensional representation of a defect, in accordance with one or more embodiments of the present disclosure.

Generally, wafer dies with non-latent defects 304 and latent defects 306 on features 302 of a device (that cause a failure or are likely to cause a failure in the future; see FIGS. 3A and 3B) may be screened out (e.g., out of the supply chain) using one or more of a variety of techniques of a screening system 100, such as inline characterization methods (e.g., inline defect inspection methods) or test methods (e.g., electrical test methods). In a general sense, inline characterization methods that generate defect results may be optical-based, but test methods that generate test results are not generally optical based (e.g., but not limited to, electric test probes). However, such techniques may unknowingly lose accuracy. For instance, a defect classifier of an inline characterization method may degrade in performance over time. A change in the number of detected defects could be caused by an actual change in the number of defects or the change may, for example, be a 'false negative' caused by an inaccurate screening system that under-detects defects.

Typically, a human may need to periodically check the accuracy of defect results of a defect classifier (e.g., manually check a sample subset using a scanning electron microscope (SEM)). Such a periodic check can be labor intensive, slow, and costly. It is noted that this example is for illustrative purposes only, and there are many other possible causes of a loss of performance of a screening system. Without such a periodic check, a screening process may operate for long periods of time before a lack of performance is detected. Therein lies a need for providing methods and systems for diagnosing a performance of a screening system.

It is contemplated that if it is known when (and/or why) the screening system performance changed then a multitude of benefits may result. These benefits include, but are not limited to, reducing the labor/cost needed to check for an inaccuracy (e.g., reducing/eliminating the frequency of periodic manual checks); reducing the number of dies/wafers that need to be re-screened when an inaccuracy is detected (e.g., by quickly determining the point in time that an inaccuracy began); and reducing the time/labor to diagnose the cause of an inaccuracy (e.g., if the cause can be automatically determined/narrowed). Further benefits may include increased situational awareness of the screening system performance generally, more accurate defect detection (e.g., to achieve Parts per Billion reliability), and higher yield.

It is contemplated herein that a correlation may exist, at least in some dies (e.g., wafer lots) and screening systems/methods, between defect results using inline defect detection methods and test results using test methods. For example, in one sense a correlation can be analogized broadly as the more defects (e.g., latent defects) detected on a particular die (e.g., indicative of a higher chance of failure), the more likely that that particular die is to fail a test (e.g., electrical probe test).

Further, it is contemplated, that such a correlation (or a lack thereof) may be reliable enough to be used to determine a performance/accuracy of the screening system. However, it should be noted that such a correlation may not historically or necessarily be reliable enough. For example, defect results have historically been extremely noisy and it may only be through recent advancements (e.g., I-PAT defect classifiers) that such results have a low enough noise level to be reliably used for such a correlation in the context of determining performance in embodiments of the present disclosure.

The correlation may be embodied in one or more different correlation metrics (e.g., but not limited to, ratios of results, ratios of binned dies based on the results, and any other metric of the results). Further still, in some embodiments, the correlation (e.g., one or more correlation metrics) may be used to determine not just when a performance of the screening system has changed, but what the cause of the change is (e.g., to one or more degrees of specificity and/or likelihood), and/or what improvement should be made to correct for the change/inaccuracy.

As used herein, the term "diagnosis", diagnostics, and the like may mean determining the performance (e.g., quantifiable accuracy, lack of accuracy, change in performance, and the like) and/or determining a source of a change in performance (e.g., whether the likely source is the inline characterization tool or the electrical test tool). It is noted herein that in some embodiments, as disclosed in figures and descriptions herein and based on experimental data (e.g., proof-of-concept studies of over 100,000 dies), the reliability of such determinations are sufficient for use in a screening system/method to cause at least some of the benefits described above.

FIGS. 1A-8 generally illustrate a system and method for determining a diagnosis of a screening system, in accordance with one or more embodiments of the present disclosure. In at least some embodiments, the system and method may be used to augment existing methods for maintenance of a screening system.

Figure 1A:
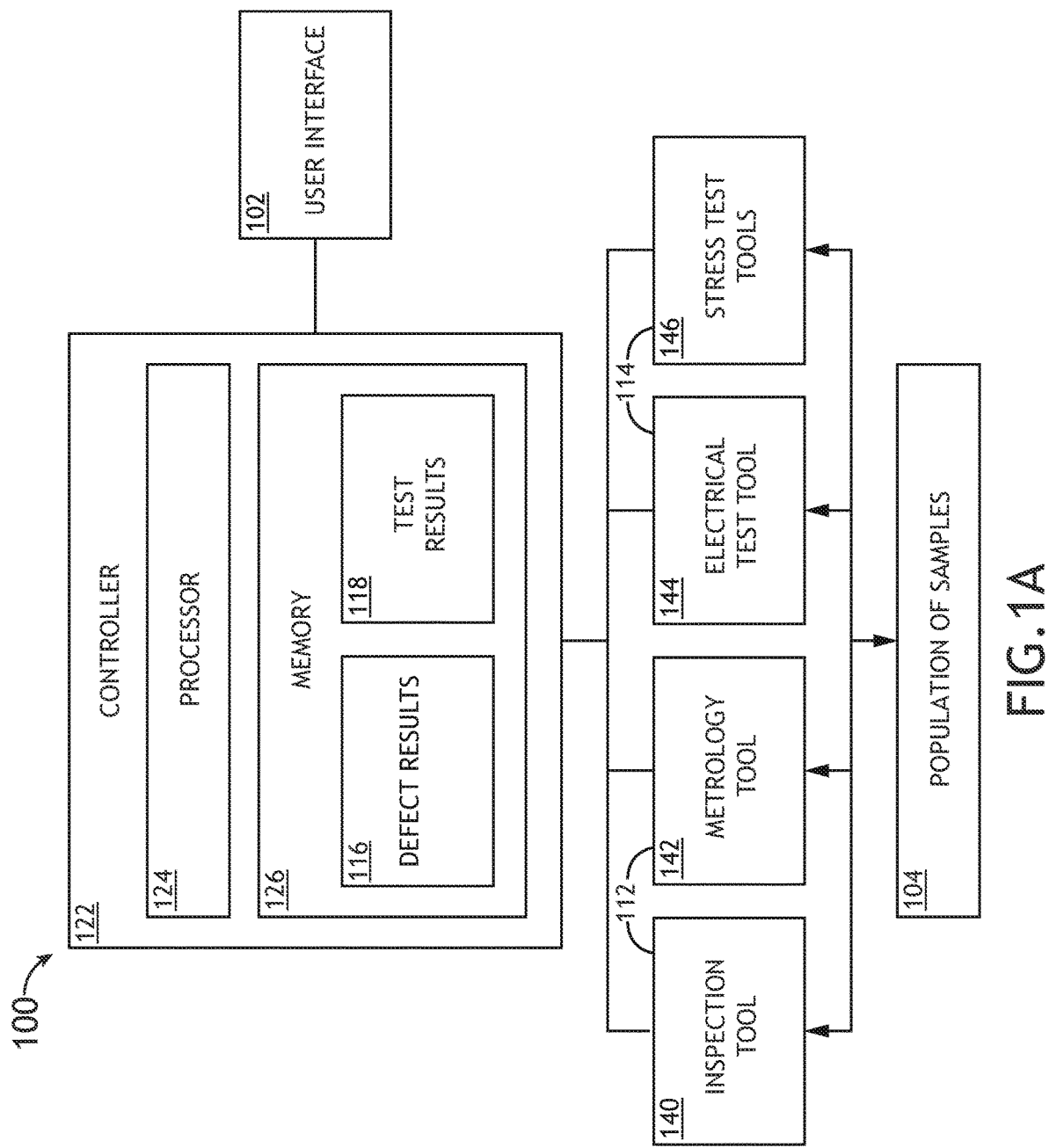
FIG. 1A illustrates a schematic block diagram of a screening system, in accordance with one or more embodiments of the present disclosure.

Referring now to FIG. 1A, a schematic block diagram of a screening system 100 is illustrated, in accordance with one or more embodiments of the present disclosure.

The screening system 100 may include, but is not limited to, one or more sample analysis tools (e.g., characterization tools 112, test tools 114). The characterization tools 112 may include, but are not limited to, an inspection tool 140 and/or a metrology tool 142. The test tools 114 may include an electrical test tool 144 and/or a stress test tool 146. The screening system 100 may additionally include, but is not limited to, a controller 122 including one or more processors 124, a memory 126, and a user interface 102. The screening system 100 may be configured to screen a population of samples 104, but does not necessarily comprise the population of samples 104 (e.g., dies). For example, the population of samples 104 may be at least one of dies in a sample, dies in multiple samples in a lot, or dies in multiple samples in multiple lots. The characterization tools may be configured to be used to generate defect results 116 and the test tools 114 may be configured to be used to generate test results 118.

In embodiments, characterization tools 112 may be any tool used in the art for sample 104 characterization, such as an inspection tool 140 and/or metrology tool 142. Results generated from a characterization tool 112 may be defect results 116 (e.g., based on inline characterization tool data received by (generated using) the characterization tool 112) and may be stored in memory 126.

In one non-limiting example, the characterization tools 112 may include an inspection tool 140 (e.g., an inline sample analysis tool) for detecting defects in one or more layers of a sample 104. The screening system 100 may generally include any type of inspection tools 140. For example, an inspection tool 140 may include an optical inspection tool configured to detect defects based on interrogation of the sample 104 with light from any source such as, but not limited to, a laser source, a lamp source, an X-ray source, or a broadband plasma source. By way of another example, an inspection tool 140 may include a particle-beam inspection tool configured to detect defects based on interrogation of the sample with one or more particle beams such as, but not limited to, an electron beam, an ion beam, or a neutral particle beam. For instance, the inspection tool 140 may include a transmission electron microscope (TEM) or a scanning electron microscope (SEM). For purposes of the present disclosure, it is noted herein the at least one inspection tool 140 may be a single inspection tool 140 or may represent a group of inspection tools 140.

For the purposes of the present disclosure, the term "defect" may refer to a physical defect found by an inline inspection tool, a metrology measurement outlier, or other physical characteristic of the semiconductor device that is deemed to be an anomaly. A defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 104 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 104. By way of another example, a defect may be a misaligned and/or mis-joined package component on the sample 104. Accordingly, it is to be understood that examples of defects in the present disclosure are provided solely for illustrative purposes and should not be interpreted as limiting.

In another non-limiting example, the characterization tools 112 may include a metrology tool 142 (e.g., an inline sample analysis tool) for measuring one or more properties of the sample 104 or one or more layers thereof. For example, a metrology tool 142 may characterize properties such as, but not limited to, layer thickness, layer composition, critical dimension (CD), overlay, or lithographic processing parameters (e.g., intensity or dose of illumination during a lithographic step). In this regard, a metrology tool 142 may provide information about the fabrication of the sample 104, one or more layers of the sample 104, or one or more semiconductor dies of the sample 104 that may be relevant to the probability of manufacturing defects that may lead to reliability issues for the resulting fabricated devices. For purposes of the present disclosure, it is noted herein the at least one metrology tool 142 may be a single metrology tool 142 or may represent a group of metrology tools 142.

In embodiments, a test tool 114 may include any number of test tools and test tool types used in the art for tests of samples 104 and test results 118. For example, a test tool 114 may include an electrical test tool 114 (e.g., configured to generate electrical burn-in test results, electrical probe test results, final electrical test results, after final test results, and the like). Such results may be test results 118 (e.g., electrical test results 118 based on electrical test data received by (generated using) the electrical test tool 144) and may be stored in memory 126.

Figure 1B:
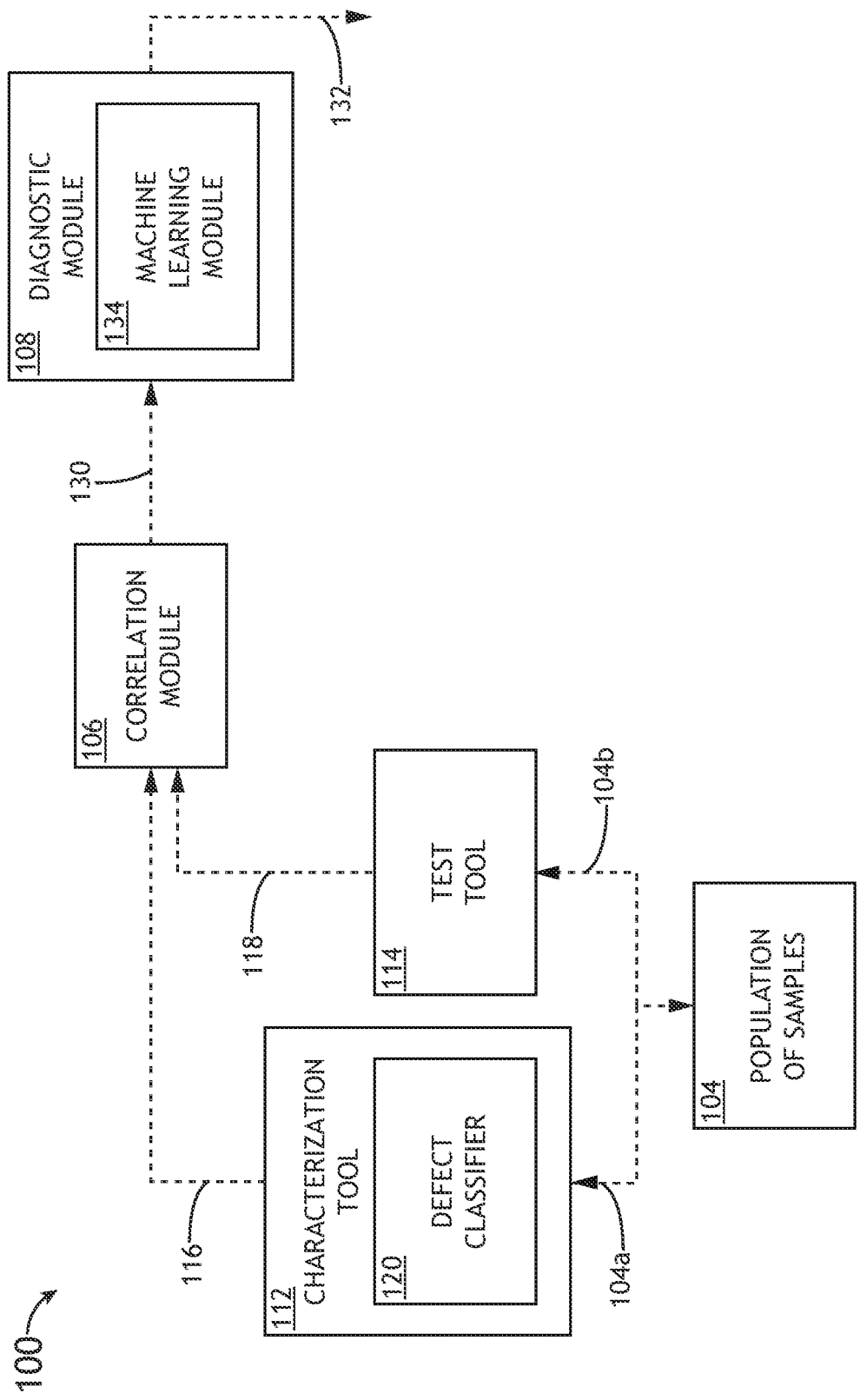
FIG. 1B illustrates a block diagram of a screening system, in accordance with one or more embodiments of the present disclosure.

Referring now to FIG. 1B, a block diagram of a screening system 100 is illustrated, in accordance with one or more embodiments of the present disclosure.

The screening system 100 may include characterization tools 112 (e.g., inspection tool 140 and/or metrology tool 142 of FIG. 1A) and test tools 114 (e.g., electrical test tool 144 of FIG. 1A) configured to screen a population of samples 104. The population of samples 104 may be screened in any order (sequentially and/or in parallel) by any technique, individually, by the lot, once or multiple times, and the like. For example, the population of samples 104 may be initially screened inline by a characterization tool 112 (e.g., inline characterization tool 112) (as shown by material flow 104a) at multiple critical manufacturing steps of the multiple layers of the population of samples 104. Next, for example, at or near the end of the manufacturing process, the population of samples 104 may be screened by the test tool 114 (e.g., to perform one or more electrical tests) (as shown by material flow 104b).

In some embodiments, defect results 116 are not limited to data (e.g., sensor data) received from (and/or by) the characterization tool 112 (e.g., from a sensor thereof), but may be derived from such data (e.g., in a defect-based classifying step 220).

For example, a defect classifier 120 may be used to obtain such defect results 116. The defect classifier 120 may be any defect classifier. For example, the defect classifier 120 may apply algorithms (machine learning, heuristic code, or otherwise) to discern characteristics of each defect detected by an inspection tool 140 to classify the defect into a category, discern multiple characteristics of the defect, and the like. For instance, the defects may be classified as killer/reliability, defect of interest, and nuisance. Appropriate weighting may then be assigned to each defect in a die based on such a classification scheme to determine an overall weighted score for the die (e.g., I-PAT score). The die score may be used to determine whether a die should be screened out (e.g., binned).

Production implementation of inline defect die screening may require a tight control of a defect classifier 120 performance, inspection tool 140 health, and/or inspection tool 140 recipe. If an unreliable die is misclassified as meeting a reliability threshold, then a potential reliability failure may enter the supply chain (i.e., under-kill, false-negative). Conversely, if a reliable die is misclassified as unreliable and removed from the supply chain then the fabrication process incurs unnecessary yield loss (i.e., overkill, false-positive).

Such misclassifications can stem from many sources, including but not limited to: inherent limitations in defect classifier 120 performance associated with defect attribute resolution from the inspection tool 140, availability of adequate training images during defect classifier 120 setup, and/or defect classifier algorithm performance; drift over time associated with changes in fabrication processing conditions, defect morphology, and/or new device implementation (e.g., variations in film thickness, while still within the device control limits, can slightly alter a defect's appearance to the screening system 100); misalignment of defect-based die coordinates with the inking/test die coordinates, which can lead to a catastrophic drop in defect classifier performance; changes to inspection tool performance; changes to inspection tool recipe; and/or the like). As a result, operators may need to spend a significant amount of time monitoring and updating defect classifier performance to ensure minimum overkill and underkill.

The defect classifier 120 may be an element of (or separate from) the characterization tool 112 (e.g., on the same or different controller). The defect classifier 120 may generally, but is not limited to, be configured to provide a variety of "defect-based" results 116 based on characterization tool data. For example, an inspection tool 140 may be used to determine results corresponding to methods of, but not limited to, detecting, re-detecting, characterizing, and/or categorizing defects (latent and/or non-latent). Further, the results of such methods may themselves be further used (e.g., in a defect-based classifying step 220; using the defect classifier 120; and the like) to perform additional analysis. For example, such results may be used to further analyze one or more die/wafer reliability (e.g., binning dies as acceptable or discardable (and such binning may be defect results 116)). For instance, an I-PAT defect classifier 120 may be used to detect/characterize defects and determine binning attributes as disclosed in U.S. Pat. No. 10,761,128, filed on Apr. 5, 2017, entitled "Methods and Systems for Inline Parts Average Testing and Latent Reliability Defect Detection", which is hereby incorporated by reference in its entirety. It is noted that the examples above are for illustrative purposes only, and any defect detection methods and systems may be used to achieve any defect-based results 116.

In some embodiments, even though an I-PAT defect classifier 120 may generally (e.g., in other disclosures) utilize a variety of types of test tool 114 based data to detect/characterize defects, the defect results 116 of the present disclosure may be based on data that does not include test tool data, such that the defect results 116 and the test results 118 (e.g., electrical test results) are based on mutually exclusive sources of data such that each is an independent indication of a reliability of the population of dies 104. Benefits of such a restriction at least include increasing a signal to noise ratio of the one or more correlation metrics 130. For example, defect results 116 may be based on the detection of physical anomalies on the sample 104 during the device manufacturing process while the test results 118 may be based on the electrical performance of the completed device.

In at least one embodiment, the screening system 100 includes a correlation module 106. In some embodiments, the correlation module 106 may be configured to generate one or more correlation metrics 130 based on the identified defect results 116 and the identified test results 118. Note that the identified defect results 116 may be in their raw form and/or in a processed form (e.g., after processed by a defect classifier 120 such as I-PAT, be in a die-binned form representing which dies are binned, or any other derived form). As noted above, a correlation between defect results 116 and test results 118 may be embodied in one or more (different) correlation metrics 130. In some examples, the correlation module 106 may be called a "Defect-to-Test Correlation Engine".

A module may mean, but is not limited to, program instructions (e.g., heuristic code, a subset of program instructions, a separate application, on the same/different controller, and/or the like), dedicated hardware/circuitry (logic gate) layouts, and/or the like.

In at least one embodiment, the screening system 100 includes a diagnostic module 108 configured to determine (output, generate, and the like) at least one diagnosis 132. In one example, the diagnostic module 108 includes a machine learning module 134.

The machine learning module may be any machine learning module configured to correlate the correlation metrics 130 to diagnosis 132 (and may be trained on similar multiple sets of training correlation metrics and multiple sets of one or more training diagnosis). Note that the diagnostic module 108 may be any module (e.g., conventional/heuristic program instructions) and does not necessarily include a machine learning module 134 as shown. In some examples, the diagnostic module 108 may be called a "Diagnostics Wizard". In at least some embodiments, the diagnostic module 108 may be configured to deconvolve the correlation metrics 130 to determine a root cause of a performance change (e.g., classifier degradation, die grid misalignment, inspector system degradation, inspector recipe issues, tester malfunction, or some other cause). For example, the machine learning module 134 may be configured to automatically determine the root cause.

Figure 2:
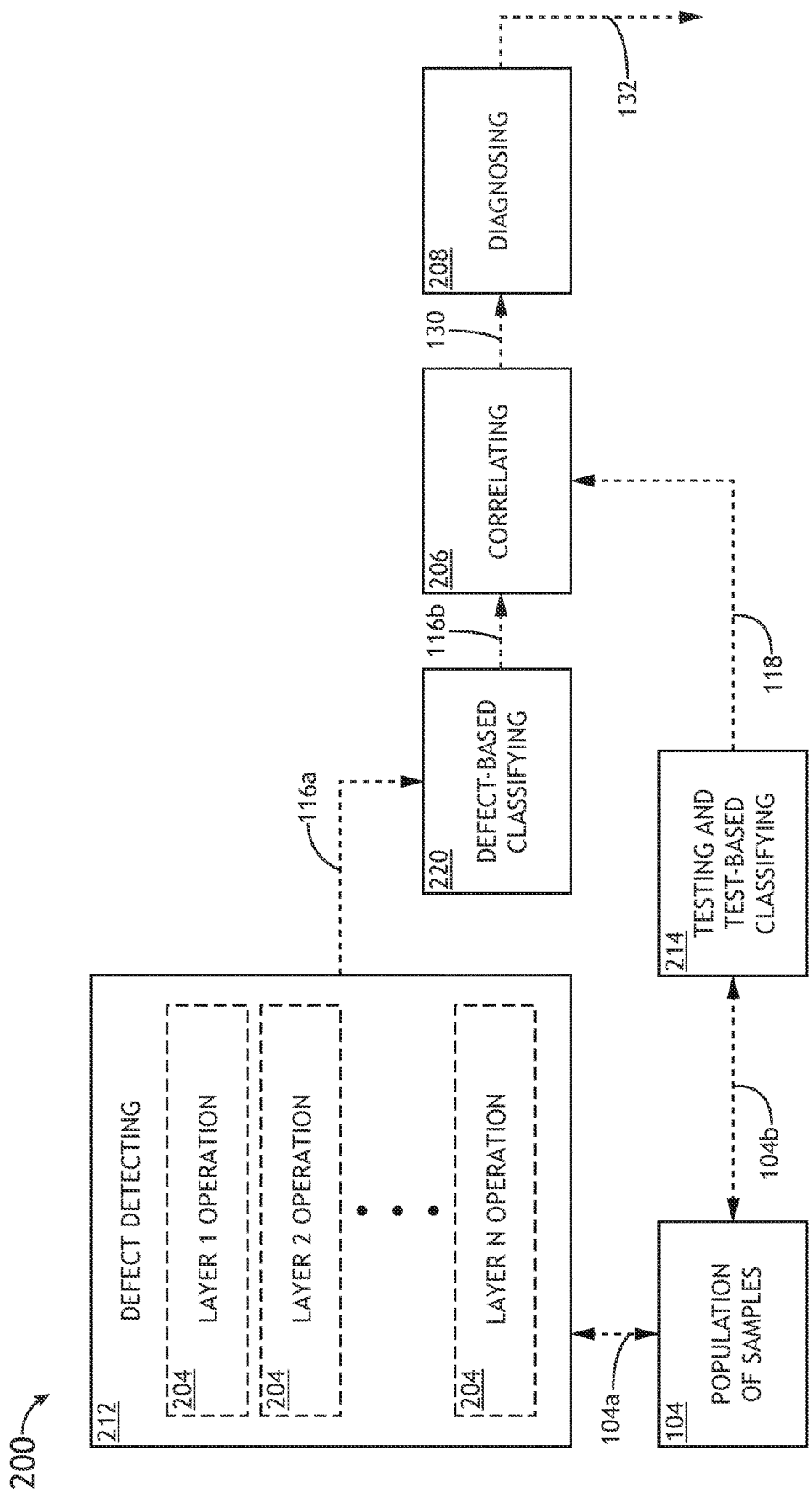
FIG. 2 illustrates a flow diagram depicting a method or process for determining a diagnosis of a screening system, in accordance with one or more embodiments of the present disclosure.

Referring now to FIG. 2, a flow diagram 200 depicting a method or process for determining a diagnosis 132 of a screening system 100 is illustrated, in accordance with one or more embodiments of the present disclosure.

A defect detecting step 212 using characterization tools 112 is shown and may comprise multiple layer operations 204 at critical manufacturing steps, and data therefrom may be aggregated (before and/or after a defect-based classifying step 220), in accordance with one or more embodiments. In at least some embodiments, 100 percent of samples 104 (e.g., 100 percent of dies) are screened at a defect detecting step 212. For example, samples 104 may be screened using an inline defect inspection tool 140 (e.g., and metrology data of a metrology tool 142).

For example, data 116a from the defect detecting step 212 may be raw sensor data and/or at least partially processed/aggregated data indicative of a number of defects detected, classified, characterized, and/or the like. Such raw and/or processed data 116a may be equivalent to defect results 116 shown in FIG. 1B in the sense that the data 116a may be ready to be used in a correlating step 206, or, alternatively, the data 116a (at least a portion thereof) may be used (e.g., aggregated, used in a module, and the like) in an optional defect-based classifying step 220 to generate defect results 116b. For example, a defect-based classifying step 220 may be used to generate defect results 116b via a defect classifier 120 such as an I-PAT defect classifier based on characterization data 116a (e.g., inline characterization tool data) of one or more characterization tools 112. Such defect results 116b may be defect results 116.

In another example, defect results 116b may be based on statistical outlier analysis such as G-PAT, P-PAT, Z-PAT, and the like.

In at least one embodiment, defects may be identified using any combination of characterization tools 112 (e.g., inspection tools 140, metrology tools 142 for use in a defect classifier, or the like), which are utilized before or after one or more layer operations 204 (e.g., lithography, etching, aligning, joining, or the like) for layers of interest in the semiconductor dies and/or semiconductor die packages. In this regard, the defect detecting step 212 at various stages of the manufacturing process may be referred to as inline defect detection. Note that the metrology tools 142 may not necessarily be used to directly image defects, but data therefrom (e.g., film thicknesses, etc.) may be used in a defect detecting step 212 (e.g., I-PAT classifier) to improve the accuracy of defect detection/characterization.

A testing and test-based classifying step 214 using test tools 114 is shown, in accordance with one or more embodiments. The testing and test-based classifying step 214 may use any test tool to analyze the reliability of a sample (e.g., die). For example, the testing and test-based classifying step 214 may include binning dies based on electrical test results 118 using an electrical test tool 144 (e.g., and/or the electrical test results 118 may itself include/be binned dies such that, for example, a ratio of binned dies may be calculated as a correlation metric).

At least some embodiments include a correlating step 206. For example, the defect results 116 from the characterization tools 112 (e.g., utilizing an I-PAT defect classifier 120) and the test results 118 may be aggregated by a correlation module 106 (as shown in FIG. 1B) to generate one or more correlation metrics 130.

At least some embodiments include a diagnosing step 208. For example, the one or more correlation metrics 130 may be used by a diagnostic module 108 (shown in FIG. 1B) to generate and/or determine at least one diagnosis 132 of a performance of the screening system 100.

The diagnosis 132 may be (e.g., or include) a degradation diagnosis indicative of a relatively low defect classifier performance (e.g., lower than previously) of the defect classifier 120.

The diagnosis 132 may be a die-level misalignment diagnosis of a sample analysis tool, as is shown and described below in relation to FIGS. 6B and 6C. The die-level misalignment diagnosis may be indicative of a die misalignment of the at least one test tool 114 relative to the at least one inline characterization tool 112.

The diagnosis 132 may be a defect recipe deviation diagnosis indicative of a change in an inline defect recipe of the at least one inline characterization tool. For example, screening system recipes (e.g., inspection recipes) may be changed without knowledge, causing an unrecorded change in performance of the screening system 100. The defect recipe deviation diagnosis may be an inline inspection defect recipe deviation diagnosis. In one example, an unauthorized change to a production recipe adversely affects performance. In another example, an inline defect inspection recipe associated with the screening system 100 is inadvertently changed to the recipe for baseline defect inspection process control. The examples above are for illustrative purposes only, and many other examples may occur, such as in less sophisticated factory automation systems of 200 mm and 150 mm processes.

The diagnosis 132 may be an inline characterization tool deviation diagnosis indicative of a deviation in at least one of hardware or software of the at least one inline characterization tool. For example, the hardware may include inspection tool 140 hardware. For example, the hardware may include a degrading illumination source (e.g., which may cause a reduction in capture rate). While many systems may have automatic monitoring and calibration of the illumination source, such an unexpected failure mode may still occur without embodiments of the present disclosure. Further, an improvement of the performance of the screening system may be determined, which may include replacing the degrading illumination source.

The diagnosis 132 may be a predicted maintenance interval diagnosis indicative of a predicted maintenance interval of a component of the screening system. Alternatively, the predicted maintenance interval diagnosis may be a predicted maintenance interval improvement.

The diagnosis 132 may be an electrical tool deviation diagnosis indicative of a deviation in a performance of the at least one electrical test tool 144. For example, a tip of an electrical probe tool 144 may be damaged, degrade, and/or the like and produce inaccurate measurements without knowledge by a user of the screening system 100.

The diagnosis 132 may be a screening system method degradation diagnosis indicative of a deviation in a performance of a screening system method as changes are made to the screening system method.

The one or more correlation metrics 130 may be generated automatically (e.g., on die populations large enough to provide a statistically significant representation of performance). Examples of a statistically significant representation of performance may include at least one of, but are not limited to, a lot of at least 5, 25, or the like wafers; a rolling average of a certain number of lots (e.g., at least 5) (see FIG. 6A); or the like.

The one or more correlation metrics 130 may include a binning ratio metric corresponding to a ratio between a number of dies of the population of dies binned for removal based upon the identified defect results 116 and a number of dies of the population of dies binned for removal (e.g., ultimately binned for removal) based upon the identified test results 118.

The one or more correlation metrics 130 may include a classifier confidence metric corresponding to an aggregate confidence score (e.g., defect score of FIG. 5, such as an aggregate confidence score, I-PAT score, defect guided Z-PAT, and/or the like) of the defect classifier 120.

The one or more correlation metrics 130 may include one or more per-class correlation metrics corresponding to one or more correlations between a class of defect results (e.g., aggregate confidence score per class) and the test results 118. For example, defects results may be filtered by their class (e.g., nuisance defect, defect of interest, and the like) and each class, or a particular subset of one or more classes, may be used to generate the one or more correlation metrics. For example, each correlation metric may be based on a different class of defect results. Classes may be determined using any method/tool known in the art, including any characterization tool (e.g., inspection tool 140 and defect classifier 120). For instance, some defects may have a stronger correlation with post package test and post burn-in final test than other defects. In some examples, a correlation metric is generated for each class of defect to each test result (of multiple types of test results).

The one or more correlation metrics 130 may include one or more per-class derivative correlation metrics corresponding to one or more derivative correlations between a derivative of an attribute of one or more attributes of a class of defect results and the electrical test results. For example, an attribute may include any attribute of a defect (e.g., size, type, shape, location, and the like, or any other attribute) and be determined by any method/tool known in the art, including any characterization tool. For example, a derivative may mean a generated correlation, filtering, computation, subclass, or any other derivation based upon one or more attributes of a class. For instance, the derivative correlations may be first derivatives. For example, a normal curve profile of defect attributes could be tracked (e.g., top ten most important attributes to a defect classifier) per class to monitor significant deviations. Such deviations may indicate a recipe change or a tool related issue. Further, a limited time series may be used, which may allow for removal of recipe changes as an extraneous variable. In addition, such a limited time series may allow for isolation of a recipe change by tracking changes from a time that the defect classifier was implemented.

In an optional step (not shown), an improvement may be determined based on the diagnosis 132. The improvement may be indicative of one or more steps that may manually and/or automatically be performed to improve the screening system 100.

In some embodiments, an improvement includes (is configured for) reducing at least one of a false positive rate or a false negative rate of the at least one inline characterization tool (and/or the electrical test tool). For example, in some embodiments, the defect classifier 120 performance is improved overall with fewer reliability escapes and/or less yield loss.

In one example, a performance of an inline defect classifier 120 degrades over time for one or more reasons (e.g., different film thickness, different types of defect characteristics not before trained on, etc.) and an improvement (e.g., a defect classifier improvement) is determined to address this issue. For example, an alert may be sent to a user that the inline defect classifier 120 has degraded and should be retrained/recalibrated based on a diagnosis that the inline defect classifier 120 is degraded. In this regard, a predictive maintenance of the defect classifier 120 may be determined.

In some embodiments, the improvement may be indicative of (correspond to) at least one of: 1) adjusting of at least one of an attribute or threshold of the defect classifier; or 2) retraining of a machine learning model of the defect classifier. For example, the improvement may be, but is not limited to, a communication that is sent to a user to alert the user that at least one of the above steps should be taken. The above example is for illustrative purposes only, and the improvement may be any improvement to any step or element of the screening system 100 and be determined by any controller, module, and the like (e.g., an output of the machine learning module 134 of the diagnostic module 108). In this regard, the correlation metrics (and/or the defect results and electrical test results) may be used to determine a root cause of a performance change of the screening system 100 and indicate/communicate that a corresponding improvement (fix) should be performed.

Figure 4A:
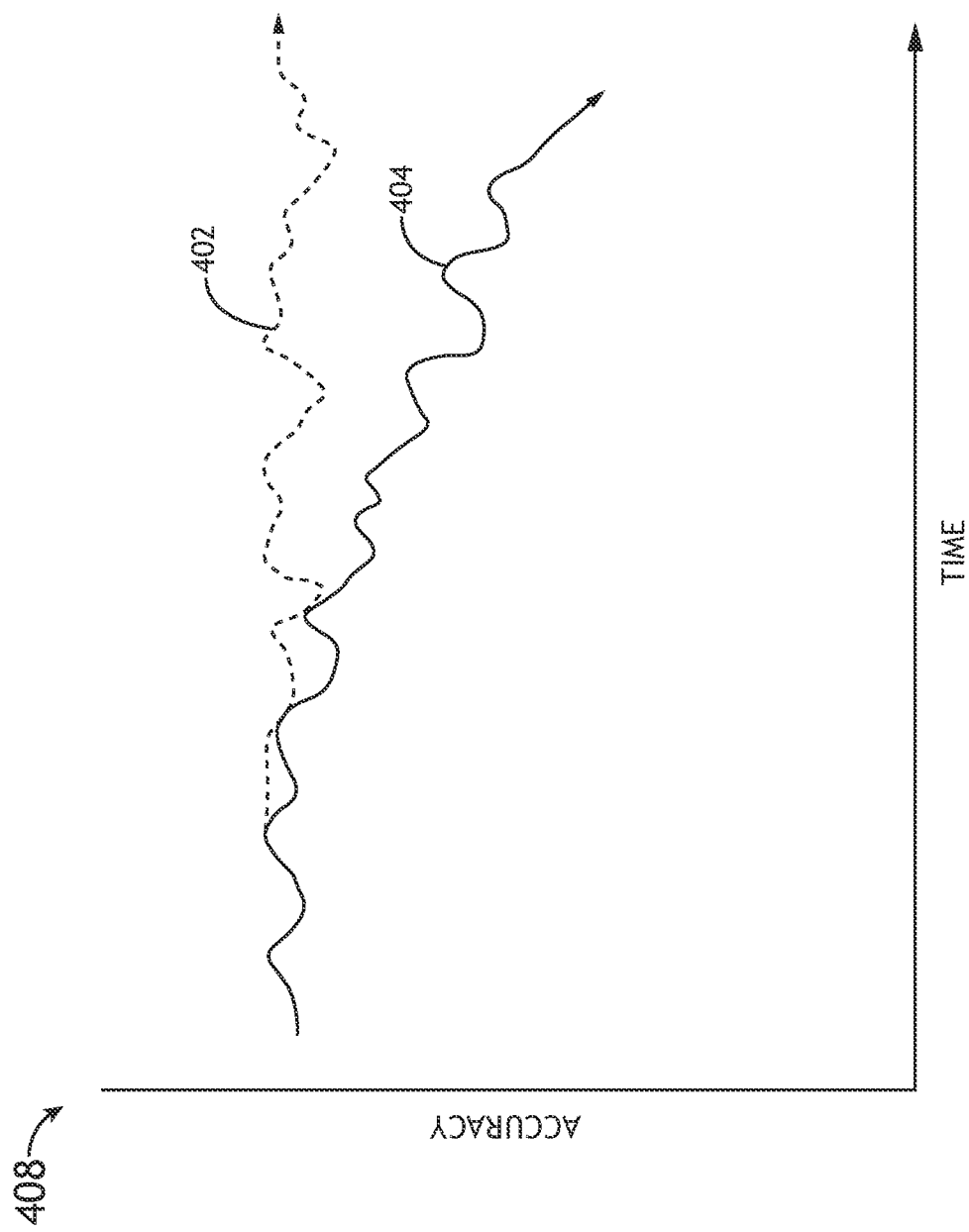
FIG. 4A illustrates a graphical representation of an accuracy of a defect classifier over time, in accordance with one or more embodiments of the present disclosure.

Referring now to FIG. 4A, a graphical representation 408 of accuracies (e.g., indicative of a performance) of a defect classifier 120 over time is illustrated. As shown, a defect classifier accuracy without intervention 404 may naturally decrease over time due to a variety of factors (e.g., changes in film thickness of the samples 104, not being trained on the types of images obtained by the characterization tool 112, and any other reason causing degradation). However, a defect classifier accuracy with intervention 402 may maintain accuracy over time (e.g., due to periodic manual checks, retraining, calibrating, and the like; and/or due to interventions (actions based on improvement determinations) of embodiments of this disclosure).

In an optional step, not shown, adaptive sampling of defect classifier 120 maintenance is determined based on correlation metrics 130.

In an optional step, not shown, a maintenance frequency of a defect classifier of the defect classifier 120 is determined based on correlation metrics 130.

In an optional step, not shown, an emergence of a new class of defects is determined based on correlation metrics 130.

In an optional step, not shown, a reduced required frequency of a manual spot-check defect classifier maintenance of the defect classifier 120 is determined based on correlation metrics 130. In this regard, a "predictive maintenance" benefit may be obtained. Traditional systems for monitoring defect classifier performance for inline defect die screening may rely on a defect-by-defect comparison of the automatic defect classifier 120 results (e.g., defect results 116*b*) with manual classification results from a human expert. This may be labor-intensive and required to be performed periodically (e.g., weekly or monthly) on a small subset of the defect population (e.g., <1%). Example results of such a comparison may be characterized by many different metrics (e.g., accuracy, purity, precision, recall, F1 score) and are charted as shown in FIG. 4B and Table 1 below.

Figure 4B:
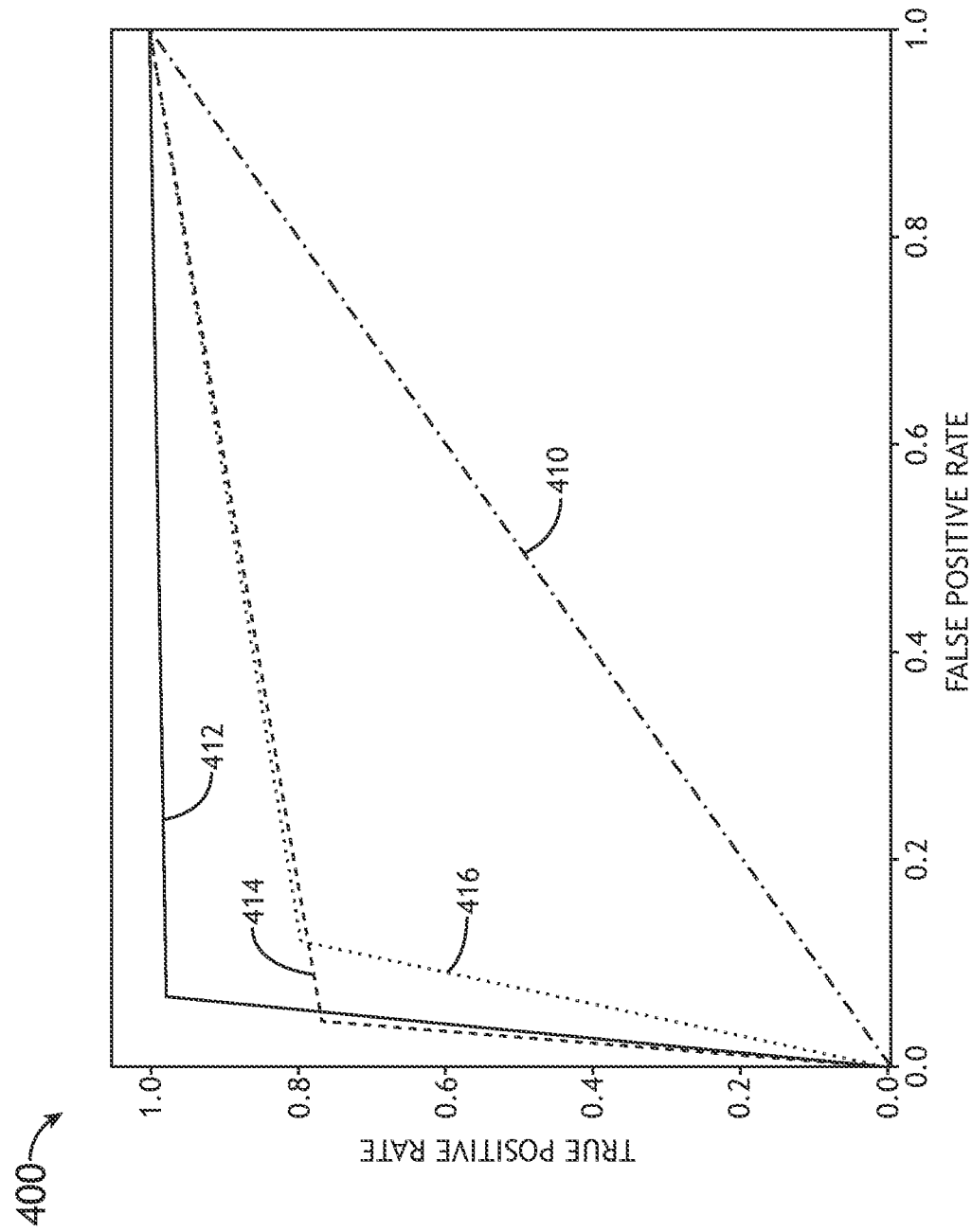
FIG. 4B illustrates a graphical representation of false positive rates of a defect classifier, in accordance with one or more embodiments of the present disclosure.

Referring now to FIG. 4B, a graphical representation 400 (e.g., Receiver Operating Characteristic (ROC) curve) of false positive rates and true positive rates of a defect classifier 120 is illustrated. As shown, a completely random prediction classifier model will generate random/useless results 410. Other models show various results 412, 414, 416 that are better than random guessing. Results 412 show a high true positive rate of an effective defect classifier model.

TABLE 1

|  | Predicted Class 1 | Predicted Class 2 | Predicted Class 3 | Purity |
| --- | --- | --- | --- | --- |
| Class 1: Nuisance | 5539 | 196 | 127 | 94% |
| Class 2: DOI | 143 | 1731 | 94 | 88% |
| Class 3: Killer | 144 | 95 | 2922 | 92% |
| Accuracy | 95% | 86% | 93% |  |

Table 1 above illustrates an example Confusion Matrix, which is typically used to compare defect classifier model-predicted results (columns) with results achieved manually by an expert (rows). The large numbers 5539, 1731, and 2922 show areas of agreement between what the classifier model predicted/identified is a Class 1, 2, or 3 defect and what the expert identified as a Class 1, 2, or 3 defect.

Generally, an ROC curve and/or a Confusion Matrix method may be methods for maintaining an (at least partially) unambiguous measure of performance of at least some sample analysis tools (e.g., in a process control system). Further, performing such methods at the defect level (e.g., rather than the die level) may generally allow for actionable insight into defect classifier improvements to make (e.g., which classes of defects are not being detected well). However, limitations of such a method indicative of being resource intensive may include being reliant on a human expert, being reliant on optical based tool and/or scanning electron microscope, being time consuming, and using increasing resources as a function of the number of screening steps. Other limitations may include utilizing a limited number of samples, inconsistency (e.g., confusion from the defect classifier being created/setup by a different user than the user evaluating the defect classifier), being limited to deviations in classifier performance (e.g., not necessarily indicative of inspection tool performance, inspection tool recipe, tester performance, or test coverage efficacy).

Figure 5:
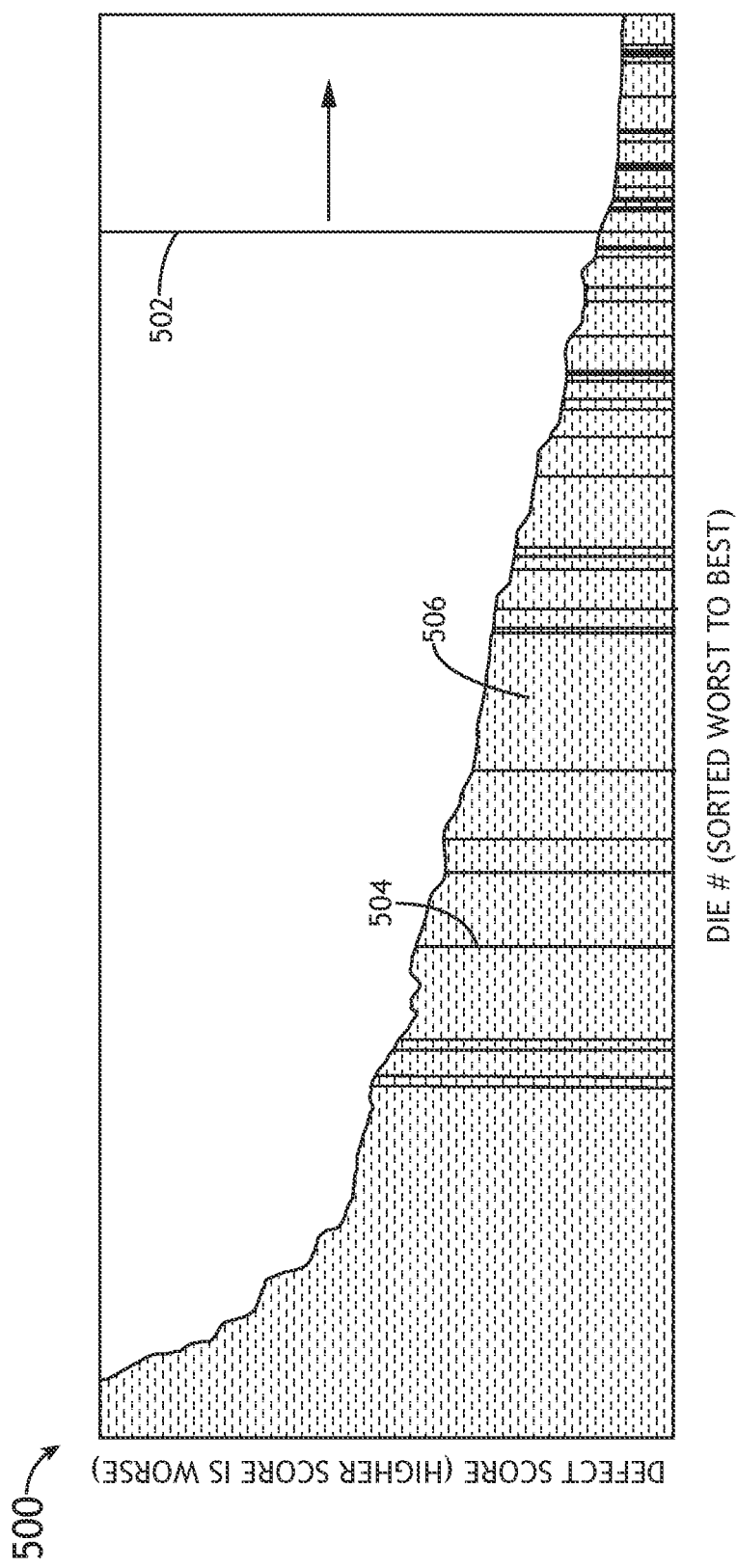
FIG. 5 illustrates a graphical representation of sorted defect results that are color coded to match corresponding electrical test results, in accordance with one or more embodiments of the present disclosure.

Referring now to FIG. 5, a graphical representation chart 500 of sorted defect results 116 that are color coded to match corresponding electrical test results 118 is illustrated. For example, defect results 116 may be a quantifiable score (e.g., I-PAT score), and electrical test results 118 may be a binary pass/fail (e.g., an overall fail if any one of multiple electrical tests of a die fail). The chart 500 may be a histogram chart where each thin, pixel-wide vertical line is a particular die sorted left-to-right from worst to best, where a taller line (higher score) is a worse, less reliable die. Further, an individual vertical line 506 (i.e., die) with a light hash pattern as shown is a failed electrical test die 506 (Note: each pixel-wide vertical line 506 is not separated from each other for clarity), and a vertical line that is black in color is a passing electrical test die 504. Note that the graph may be truncated and may show less than 1 percent of the worst few hundred of many (e.g., thousands of) dies. An outlier cutoff threshold 502 may be determined such that all dies to the left of the outlier cutoff threshold 502 are binned for discarding. For example, FIG. 5 may be indicative of a correlation of approximately 93 percent of agreement between defect results 116 and electrical test results 118 binned for removal. Such a correlation (or other correlation metrics 130) may be high enough (and consistent enough) to be used in one or more embodiments of the present disclosure.

Generally speaking, as is shown by the lack (low density) of passing electrical test dies 504 to the left side of the chart 500, it is not likely that a die will have a high (poor) defect score and still pass all electrical tests. As evidenced by the increasing density of passing electrical test dies 504 on the right side of the chart 500 (e.g., more black lines), the lower the defect score is, the higher the likelihood that that particular die will pass an electrical test. This is, in general terms, illustrative of a "correlation" as described throughout this disclosure. For example, (for illustrative purposes only, and not necessarily a likely outcome) if most of the passing electrical test dies 504 were instead on the left side of the sorted chart (or randomly dispersed), rather than the right side, then such an example would be indicative of a "lack of correlation" and may indicate a malfunctioning characterization tool 112 or test tool 114.

Figure 6A:
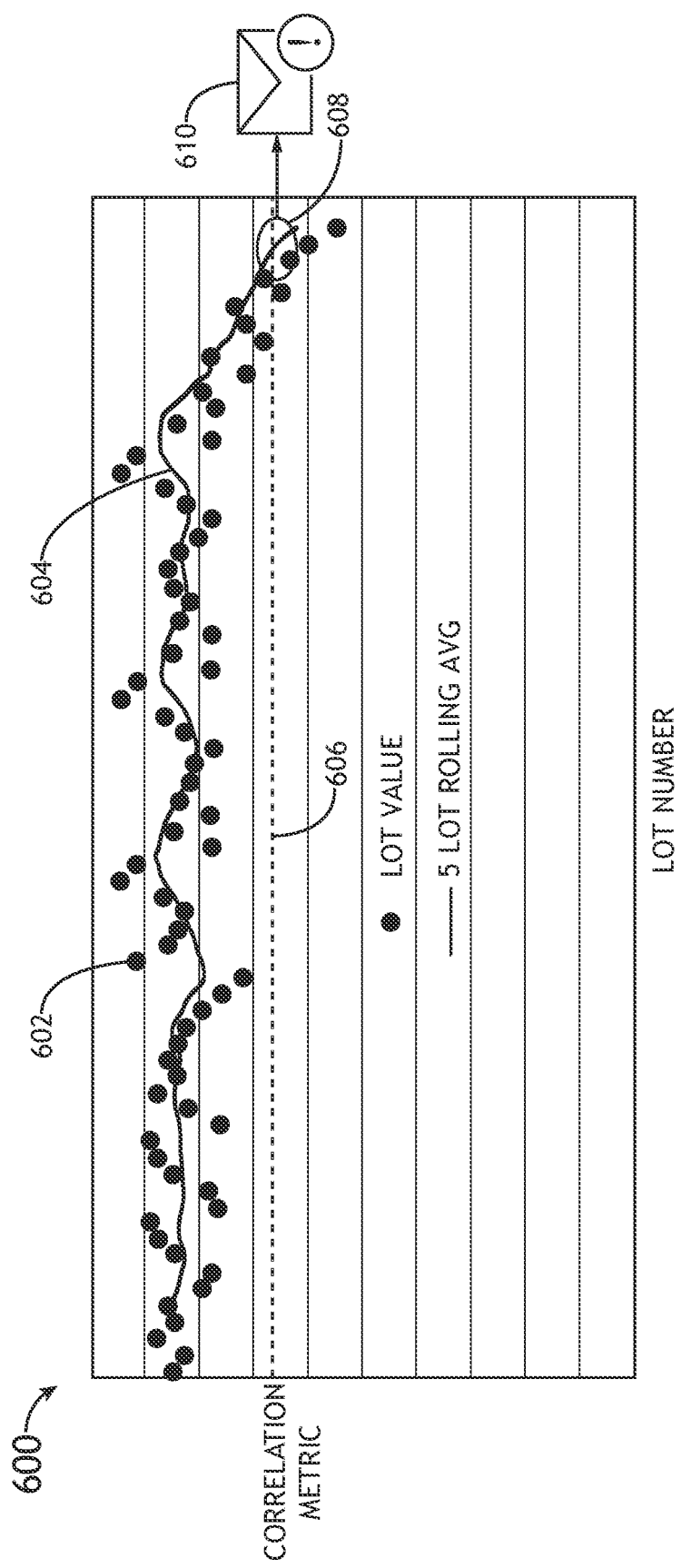
FIG. 6A illustrates a graphical representation of a process control chart, in accordance with one or more embodiments of the present disclosure.

Referring now to FIG. 6A, a graphical representation of a statistical process control (SPC) chart 600 is illustrated, in accordance with one or more embodiments of the present disclosure. Variations of embodiments using a SPC chart 600 may include adaptive sampling and/or predictive maintenance of defect classifier 120.

In some embodiments, generating the one or more correlation metrics 130 may include generating one or more process control chart data of the one or more correlation metrics 130 configured to allow for tracking the one or more correlation metrics 130. In some embodiments, determining a diagnosis 132 of the screening system includes monitoring a control limit threshold corresponding to a process control chart data of the one or more process control chart data; and identifying a control limit threshold breach based on the control limit threshold and the process control chart data.

For example, the one or more process control chart data may be a plurality of lot values 602 as shown, where each lot value 602 is a value of a correlation metric 130 for a particular lot (of samples) 104. In some embodiments, a lower control limit threshold 606 may be used to determine when the performance of the screening system 100 has changed. For instance, any statistical tracking method may be used in the art, such as, but not limited to, a 5 lot rolling average 604. In another example, any Western Electric rule may be used to determine a breach of a control limit 606, such as determining when 1) any single data point falls outside a 3σ-limit from a centerline of the data; 2) two out of three consecutive points fall beyond a 2σ-limit; 3) four out of five consecutive points fall beyond a 1σ-limit; 4) nine consecutive points fall on the same side of a centerline; and/or the like.

If it is determined that a breach 608 of the control limited threshold 606 has occurred, then a diagnosis 132 may be generated, triggered, updated, determined, transmitted, and the like. Alert 610 may be an alert diagnosis configured to alert a user or module of a decrease in performance.

Figure 6B:
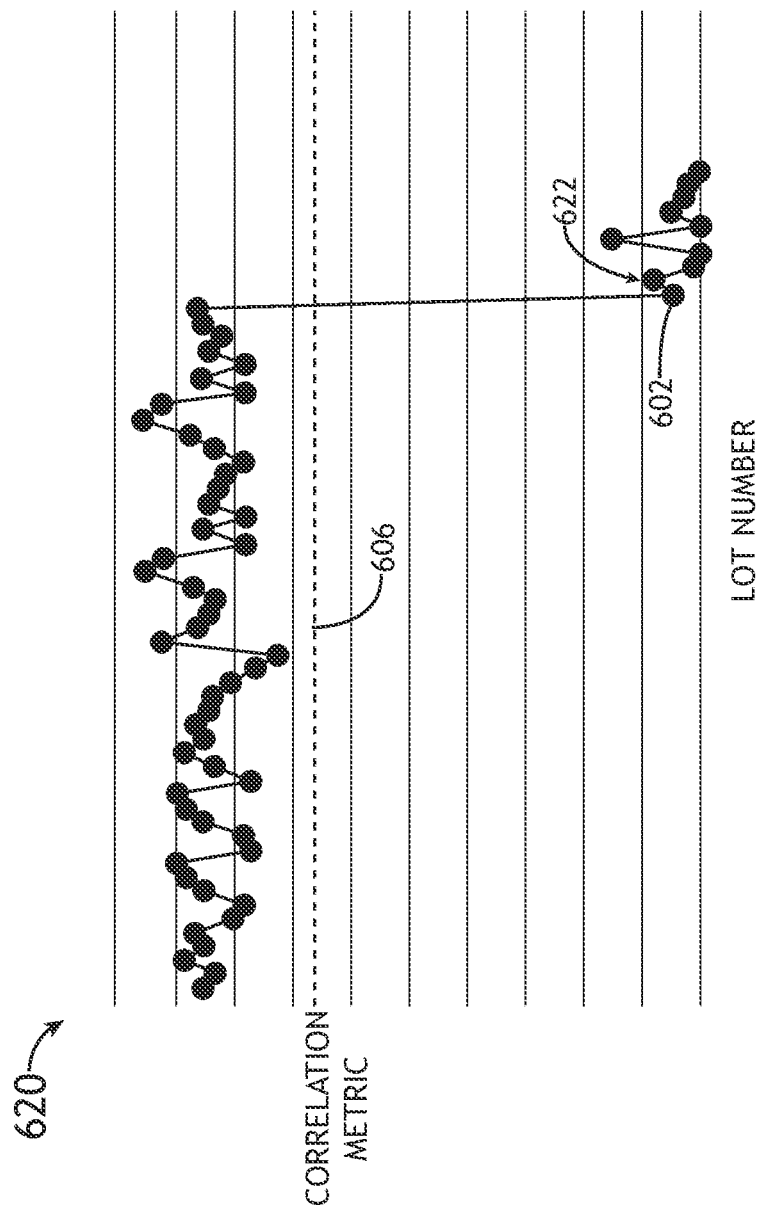
FIG. 6B illustrates a graphical representation of a process control chart of a die-misalignment associated with a screening of a wafer, in accordance with one or more embodiments of the present disclosure.

Referring now to FIGS. 6B and 6C, an example of a particular failure case of a die-level misalignment of the characterization tool 112 and the test tool 114 is illustrated. FIG. 6B illustrates a graphical representation 620 of a process control chart of a die-misalignment associated with a screening of a wafer. FIG. 6C illustrates a diagrammatic representation 624 of the wafer of FIG. 6B.

As shown in FIG. 6C, the wafer may include many dies (e.g., dies 626, 630, 632). Dies may generally be binned based on detected defects. For example, a diagonal pattern of defects (black dots) starting near location 628 may cause a diagonal pattern of dies to be binned. As shown in the present example, at some point in the screening process of the example wafer, the test tool 114 became misalign with the dies such that the test tool 114 was testing a die one position to the right and one position above the die that the test tool 114 was configured to be testing, skewing the results. As a result, when mapped to the wafer, the pattern of electrical screened dies 632 binned (inked off) using the electrical test results were incorrectly binned compared to defect screened dies 630 that were more accurately binned. Such a misalignment event may cause massive false-positive (overkill) and false-negative (underkill) binning.

As shown in FIG. 6B, in relation to FIG. 6C, such an event may cause a sudden drop 622 in lot values 602 (of a correlation metric) below a control threshold 606. This sudden drop may be used to alert a user of such a misalignment. In some embodiments, such a misalignment may be used in methods related to inline defect die screening; inline metrology die screening; kill ratio, kill probability analysis; yield prediction; and/or the like.

Figure 7:
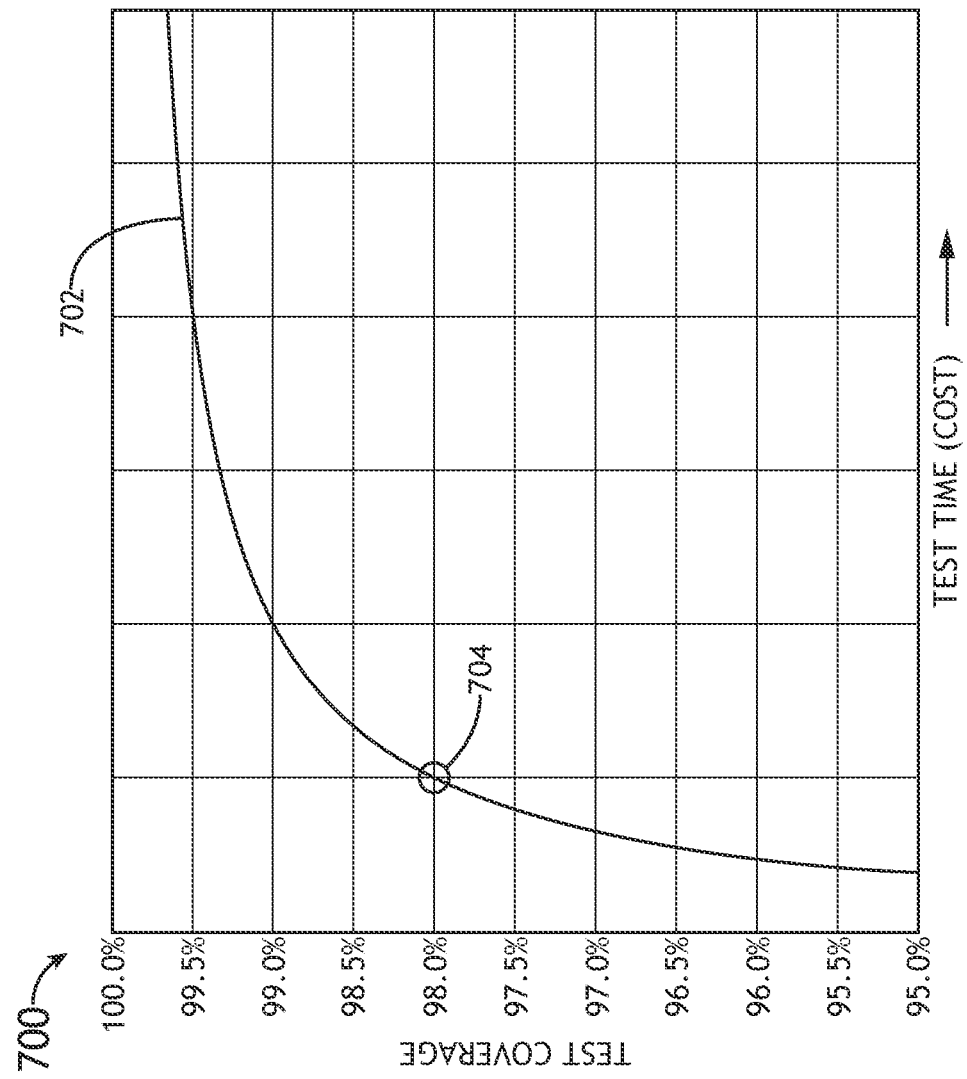
FIG. 7 illustrates a graphical representation of test coverage and test time usable in an electrical test program assessment, in accordance with one or more embodiments of the present disclosure.

Referring now to FIG. 7, a graphical representation 700 of a plot line 702 of test coverage and test time (usable in a test recipe of a test tool 114 (e.g., test program assessment)) is illustrated, as may be used typically.

Generally, higher test coverage provides greater protection against defect escapes. However, the test time required generally increases exponentially as test coverage approaches 100%. Cost-benefit point 704 (e.g., AEC specification for stuck-at-fault coverage) may be an optimal point of test coverage (such as 98%), considering the test time (e.g., labor/cost). Test time may be adjusted over the lifetime of the manufacturing of a device. These adjustments may incorporate improvements to the test program that address gaps which may have been found. However, often, an adjustment to the test program is to reduce test coverage as the manufacturing of the sample improves or in response to "cost down" pressures from the customer. Benefits of at least some embodiments of the present disclosure may allow for higher test coverage and/or less cost than is typically achieved. For example, the correlation module 106 may be used to provide correlation metrics 130 that allow an improved test program assessment (e.g., tradeoff between test time and test coverage).

In some embodiments, the one or more correlation metrics 130 may be used to provide valuable feedback and/or to optimize/adjust an electrical test recipe. For example, typically, Design-for-Test (DFT) personnel may need to optimize electrical test costs for a particular screening process. Fault models may be used to identify patterns required to detect electrical faults at most points in a sample (circuit of a die) equating to high coverage. Generally, higher coverage can often be achieved by more test times and more engineering times to write the tests, but this comes at the expense of more cost/labor.

Figure 8:
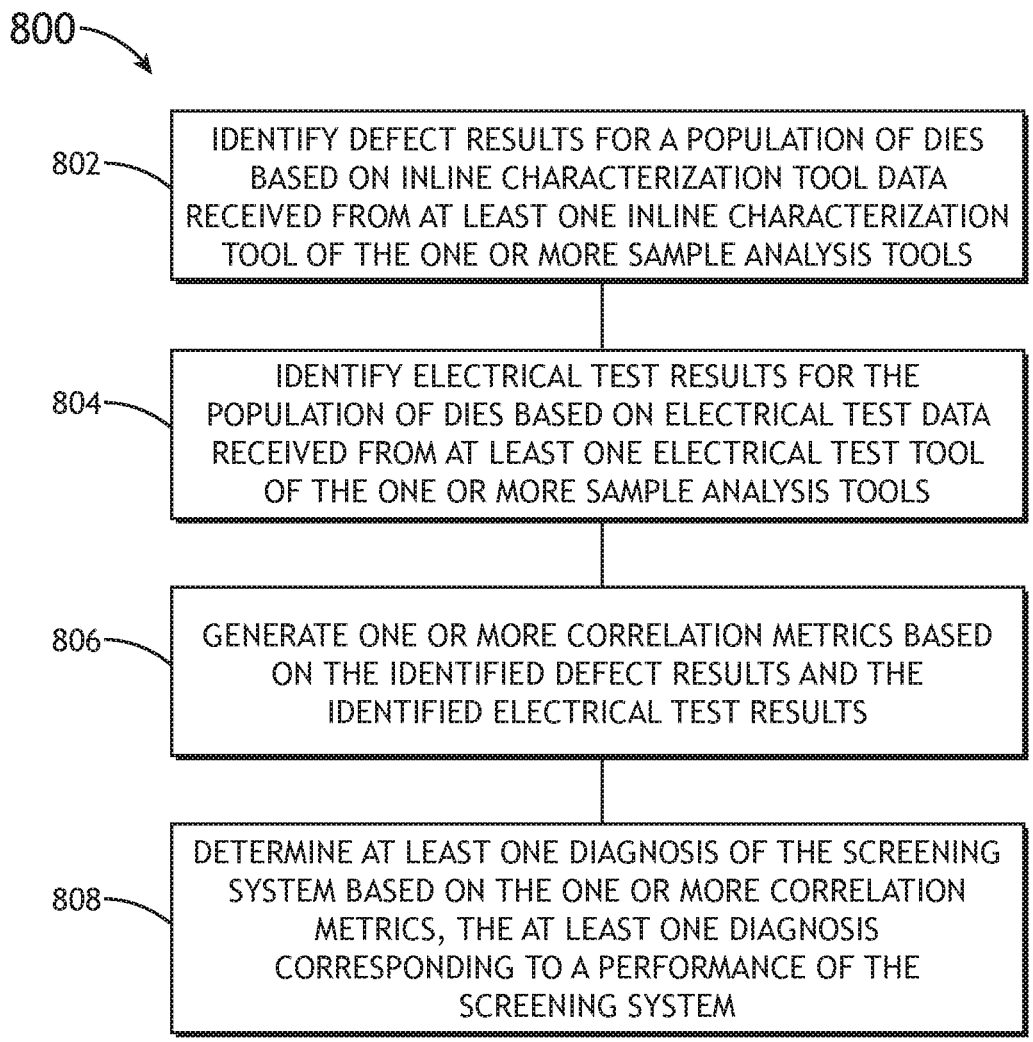
FIG. 8 illustrates a flow diagram depicting a method or process for determining a diagnosis of a screening system, in accordance with one or more embodiments of the present disclosure.

FIG. 8 is a flow diagram depicting a method 800 (or process) for determining a diagnosis 132 of a screening system 100 configured in accordance with the present disclosure. For example, controller 122 may be configured to be communicatively coupled to one or more sample analysis tools and may include processors configured to execute program instructions causing the one or more processors to perform the steps of method 800 (and any step, method, or the like of this disclosure).

At step 802, defect results 116 for a population of dies 104 based on inline characterization tool data received from at least one inline characterization tool 112 of one or more sample analysis tools of a screening system 100 may be identified (determined, received, acquired, generated, and the like).

At step 804, electrical test results 118 for the population of dies 104 based on electrical test data received from at least one electrical test tool 144 of the one or more sample analysis tools may be identified (determined, received, acquired, generated, and the like).

At a step 806, one or more correlation metrics 130 based on the identified defect results 116 and the identified electrical test results 118 may be generated.

At a step 808, at least one diagnosis 132 of the screening system based on the one or more correlation metrics 130 may be determined, the at least one diagnosis 132 corresponding to a performance of the screening system 100. For example, determining the at least one diagnosis 132 may include acquiring a diagnostic module 108 configured to determine the at least one diagnosis 132 of the screening system 100; and determining the at least one diagnosis 132 via the diagnostic module 108.

Referring again to FIG. 1A, embodiments of various components are described in additional detail.

As noted previously herein, the controller 122 of screening system 100 may include one or more processors 124 and memory 126. The memory 126 may include program instructions configured to cause the one or more processors 124 to carry out various steps of the present disclosure.

In another embodiment, the display of the user interface 102 may be configured to display data of screening system 100 to a user.

As noted previously herein, the one or more processors 124 of the controller 122 may be communicatively coupled to memory 126, wherein the one or more processors 124 may be configured to execute a set of program instructions maintained in memory 126, and the set of program instructions may be configured to cause the one or more processors 124 to carry out various functions and steps of the present disclosure.

It is noted herein that the one or more components of screening system 100 may be communicatively coupled to the various other components of screening system 100 in any manner known in the art. For example, the one or more processors 124 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 122 may be communicatively coupled to one or more components of screening system 100 via any wireline or wireless connection known in the art.

In one embodiment, the one or more processors 124 may include any one or more processing elements known in the art. In this sense, the one or more processors 124 may include any microprocessor-type device configured to execute software algorithms and/or instructions. In one embodiment, the one or more processors 124 may consist of a desktop computer, mainframe computer system, workstation, image computer, parallel processor, or other computer system (e.g., networked computer) configured to execute a program configured to operate the screening system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 124. In general, the term "processor" may be broadly defined to encompass any device having one or more processing elements, which execute program instructions from memory 126. Moreover, different subsystems of the screening system 100 (e.g., characterization tool 112, test tool 114, controller 122, user interface 102, and the like) may include processor or logic elements suitable for carrying out at least a portion of the steps described throughout the present disclosure. Therefore, the above description should not be interpreted as a limitation on the present disclosure but merely an illustration.

The memory 126 may include any storage medium known in the art suitable for storing program instructions executable by the associated one or more processors 124 and the data received from the screening system 100. For example, the memory 126 may include a non-transitory memory medium. For instance, the memory 126 may include, but is not limited to, a read-only memory (ROM), a random-access memory (RAM), a magnetic or optical memory device (e.g., disk), a magnetic tape, a solid-state drive and the like. It is further noted that memory 126 may be housed in a common controller housing with the one or more processors 124. In an alternative embodiment, the memory 126 may be located remotely with respect to the physical location of the processors 124, controller 122, and the like. In another embodiment, the memory 126 maintains program instructions for causing the one or more processors 124 to carry out the various steps described through the present disclosure.

In one embodiment, the user interface 102 is communicatively coupled to the controller 122. The user interface 102 may include, but is not limited to, one or more desktops, tablets, smartphones, smart watches, or the like. In another embodiment, the user interface 102 includes a display used to display data of the screening system 100 to a user. The display of the user interface 102 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 102 is suitable for implementation in the present disclosure. In another embodiment, a user may input selections and/or instructions responsive to data displayed to the user via a user input device of the user interface 102. For example, a user may view (or a controller may be configured to display) one or more correlation metrics 130, a diagnosis 132, or an improvement. In at least one embodiment, the screening system is configured to display a graphical user interface on the user interface 102, where the graphical user interface includes quantitative representations of correlation metrics 130 and improvements (e.g., recommendations).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems and/or components described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A screening system comprising:
   a controller communicatively coupled to one or more sample analysis tools, wherein the one or more sample analysis tools comprise at least one inline characterization tool and at least one electrical test tool, the controller including one or more processors configured to execute program instructions causing the one or more processors to:
      identify, with a defect classifier of the at least one inline characterization tool, defect results for a population of dies based on inline characterization tool data received from the at least one inline characterization tool of the one or more sample analysis tools;
      identify electrical test results for the population of dies based on electrical test data received from the at least one electrical test tool of the one or more sample analysis tools;
      generate one or more correlation metrics based on the identified defect results and the identified electrical test results, wherein the one or more correlation metrics comprise a classifier confidence metric of the defect classifier; and
      determine at least one diagnosis of the screening system based on the one or more correlation metrics, the at least one diagnosis corresponding to a performance of the screening system.

2. The screening system of claim 1, wherein the one or more processors are further configured to the execute program instructions causing the one or more processors to determine a reduced required frequency of a manual spot-check defect classifier maintenance of the defect classifier.

3. The screening system of claim 1, wherein the at least one diagnosis of the screening system comprises a degradation diagnosis indicative of a defect classifier performance of the defect classifier of the at least one inline characterization tool.

4. The screening system of claim 3, wherein the one or more processors are further configured to execute the program instructions causing the one or more processors to:
   determine a defect classifier improvement based on the degradation diagnosis, the defect classifier improvement corresponding to at least one of:
      adjusting of at least one of an attribute or threshold of the defect classifier; or
      retraining of a machine learning model of the defect classifier.

5. The screening system of claim 1, wherein the at least one inline characterization tool comprises:
   at least one of an inspection tool or a metrology tool.

6. The screening system of claim 1, wherein the population of dies comprises:
   at least one of dies in a sample, dies in multiple samples in a lot, or dies in multiple samples in multiple lots.

7. The screening system of claim 1, wherein the identified defect results and the identified electrical test results are based on mutually exclusive sources of data such that each is an independent indication of a reliability of the population of dies.

8. The screening system of claim 1, wherein the one or more correlation metrics comprise a binning ratio metric corresponding to a ratio between a number of dies of the population of dies binned for removal based upon the identified defect results and a number of dies of the population of dies binned for removal based upon the identified electrical test results.

9. The screening system of claim 1, wherein the determine the at least one diagnosis comprises:
   acquiring a diagnostic module configured to determine the at least one diagnosis of the screening system; and
   determining the at least one diagnosis via the diagnostic module.

10. The screening system of claim 9, wherein the diagnostic module comprises a machine learning model trained for correlating multiple sets of training correlation metrics and multiple sets of one or more training diagnosis.

11. The screening system of claim 1, wherein the one or more processors are further configured to execute program instructions causing the one or more processors to:
   determine an improvement of the performance of the screening system based on the at least one diagnosis.

12. The screening system of claim 11, wherein the improvement of the performance of the screening system comprises at least one of:
   reducing at least one of a false positive rate or a false negative rate of the at least one inline characterization tool; or
   reducing at least one of a false positive rate or a false negative rate of the at least one electrical test tool.

13. The screening system of claim 12, wherein the at least one diagnosis comprises a die layout misalignment diagnosis indicative of a die misalignment of the at least one electrical test tool relative to the at least one inline characterization tool.

14. The screening system of claim 12, wherein the at least one diagnosis comprises an inline defect recipe deviation diagnosis indicative of a change in an inline defect recipe of the at least one inline characterization tool.

15. The screening system of claim 12, wherein the at least one diagnosis comprises an inline characterization tool deviation diagnosis indicative of a deviation in at least one of hardware or software of the at least one inline characterization tool.

16. The screening system of claim 15, wherein the hardware comprises a degrading illumination source, wherein the improvement of the performance of the screening system comprises replacing the degrading illumination source.

17. The screening system of claim 1, wherein the at least one diagnosis comprises at least one of:
   a misalignment between the at least one electrical test tool and the at least one inline characterization tool;
   a predicted maintenance interval of a component of the screening system;
   a deviation of an inline defect inspection recipe;
   a deviation in a software and/or hardware of the at least one inline characterization tool; or
   a deviation in a performance of the at least one electrical test tool.

18. The screening system of claim 1, wherein the generate the one or more correlation metrics comprises generating one or more process control chart data of the one or more correlation metrics configured to allow for tracking the one or more correlation metrics.

19. The screening system of claim 18, wherein the determining the at least one diagnosis of the screening system comprises:
   monitoring a control limit threshold corresponding to a process control chart data of the one or more process control chart data; and
   identifying a control limit threshold breach based on the control limit threshold and the process control chart data.

20. The screening system of claim 1, wherein the one or more correlation metrics comprise one or more per-class correlation metrics corresponding to one or more correlations between a class of defect results and the electrical test results.

21. The screening system of claim 1, wherein the one or more correlation metrics comprise one or more per-class derivative correlation metrics corresponding to one or more derivative correlations between a derivative of an attribute of one or more attributes of a class of defect results and the electrical test results.

22. A method for screening comprising:
   identifying, with a defect classifier of the at least one inline characterization tool, defect results for a population of dies based on inline characterization tool data received from at least one inline characterization tool of one or more sample analysis tools of a screening system;
   identifying electrical test results for the population of dies based on electrical test data received from at least one electrical test tool of the one or more sample analysis tools;
   generating one or more correlation metrics based on the identified defect results and the identified electrical test results, wherein the one or more correlation metrics comprise a classifier confidence metric of the defect classifier; and
   determining at least one diagnosis of the screening system based on the one or more correlation metrics, the at least one diagnosis corresponding to a performance of the screening system.

23. The method of claim 22, wherein the at least one diagnosis comprises a degradation diagnosis indicative of a defect classifier performance of the defect classifier of the at least one inline characterization tool.

24. The method of claim 23, further comprising:
   determining a defect classifier improvement based on the degradation diagnosis, the defect classifier improvement corresponding to at least one of:
      adjusting of at least one of an attribute or threshold of the defect classifier; or
      retraining of a machine learning model of the defect classifier.

25. The method of claim 22, further comprising determining a reduced required frequency of a manual spot-check defect classifier maintenance of the defect classifier.

26. The method of claim 22, wherein the at least one inline characterization tool comprises:
   at least one of an inspection tool or a metrology tool.

27. The method of claim 22, wherein the population of dies comprises:
   at least one of dies in a sample, dies in multiple samples in a lot, or dies in multiple samples in multiple lots.

28. The method of claim 22, wherein the identified defect results and the identified electrical test results are based on mutually exclusive sources of data such that each is an independent indication of a reliability of the population.

29. The method of claim 22, wherein the one or more correlation metrics comprise a binning ratio metric corresponding to a ratio between a number of dies of the population of dies binned for removal based upon the identified defect results and a number of dies of the population of dies binned for removal based upon the identified electrical test results.

30. The method of claim 22, wherein the determining the at least one diagnosis comprises:
   acquiring a diagnostic module configured to determine the at least one diagnosis of the screening system; and
   determining the at least one diagnosis via the diagnostic module.

31. The method of claim 30, wherein the diagnostic module comprises a machine learning model trained for correlating multiple sets of training correlation metrics and multiple sets of one or more training diagnosis.

32. The method of claim 22, further comprising:
   determining an improvement of the performance of the screening system based on the at least one diagnosis.

33. The method of claim 32, wherein the improvement of the performance of the screening system comprises at least one of:
   reducing at least one of a false positive rate or a false negative rate of the at least one inline characterization tool; or
   reducing at least one of a false positive rate or a false negative rate of the at least one electrical test tool.

34. The method of claim 33, wherein the at least one diagnosis comprises a die layout misalignment diagnosis indicative of a die misalignment of the at least one electrical test tool relative to the at least one inline characterization tool.

35. The method of claim 33, wherein the at least one diagnosis comprises an inline defect recipe deviation diagnosis indicative of a change in an inline defect recipe of the at least one inline characterization tool.

36. The method of claim 33, wherein the at least one diagnosis comprises an inline characterization tool deviation diagnosis indicative of a deviation in at least one of hardware or software of the at least one inline characterization tool.

37. The method of claim 36, wherein the hardware comprises a degrading illumination source, wherein the improvement of the performance of the screening system comprises replacing the degrading illumination source.

38. The method of claim 22, wherein the at least one diagnosis comprises at least one of:
- a misalignment between the at least one electrical test tool and the at least one inline characterization tool;
- a predicted maintenance interval of a component of the screening system;
- a deviation of an inline defect inspection recipe;
- a deviation in a software and/or hardware of the at least one inline characterization tool; or
- a deviation in a performance of the at least one electrical test tool.

39. The method of claim 22, wherein the generating the one or more correlation metrics comprises generating one or more process control chart data of the one or more correlation metrics configured to allow for tracking the one or more correlation metrics.

40. The method of claim 39, wherein the determining the at least one diagnosis of the screening system comprises:
- monitoring a control limit threshold corresponding to a process control chart data of the one or more process control chart data; and
- identifying a control limit threshold breach based on the control limit threshold and the process control chart data.

41. The method of claim 22, wherein the one or more correlation metrics comprise one or more per-class correlation metrics corresponding to one or more correlations between a class of defect results and the electrical test results.

42. The method of claim 22, wherein the one or more correlation metrics comprise one or more per-class derivative correlation metrics corresponding to one or more derivative correlations between a derivative of an attribute of one or more attributes of a class of defect results and the electrical test results.

* * * * *